(12) United States Patent  (10) Patent No.: US 7,501,657 B2
Nagai  (45) Date of Patent: Mar. 10, 2009

(54) SEMICONDUCTOR LIGHT EMITTING DEVICE, LIGHTING MODULE, ILLUMINATION APPARATUS, SURFACE MOUNT LED, AND BULLET LED

(75) Inventor: Hideo Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 6 days.

(21) Appl. No.: 11/577,700

(22) PCT Filed: Nov. 18, 2005

(86) PCT No.: PCT/JP2005/021635

§ 371 (c)(1),
(2), (4) Date: Apr. 20, 2007

(87) PCT Pub. No.: WO2006/059535

PCT Pub. Date: Jun. 8, 2006

(65) Prior Publication Data

US 2008/0093614 A1  Apr. 24, 2008

(30) Foreign Application Priority Data

Nov. 30, 2004 (JP) ............................. 2004-347430

(51) Int. Cl.
H01L 27/15 (2006.01)
(52) U.S. Cl. ..................... 257/79; 257/81; 257/99; 257/100
(58) Field of Classification Search ................ 257/13, 257/14, 79, 81, 99, 100, E33.059, E33.065
See application file for complete search history.

(56) References Cited

U.S. PATENT DOCUMENTS 6,262,441 B1 *  7/2001  Bohler et al. ............... 257/103
6,784,463 B2 *  8/2004  Camras et al. ................ 257/99
7,253,450 B2 *  8/2007  Senda et al. ................. 257/100
7,294,864 B2 * 11/2007  Kim et al. ...................... 257/98
2002/0070449 A1   6/2002  Yagi et al.
2002/0171090 A1 * 11/2002  Oohata et al. .................. 257/88
2003/0017633 A1 *  1/2003  Doi et al. ........................ 438/22
2003/0189829 A1 * 10/2003  Shimizu et al. .............. 362/240
2004/0048409 A1 *  3/2004  Biwa et al. ..................... 438/46
2004/0095063 A1   5/2004  Murazaki et al.
2004/0097006 A1   5/2004  Lowery
2004/0178417 A1   9/2004  Andrews
2004/0188696 A1 *  9/2004  Chen et al. ..................... 257/99
2005/0218421 A1 * 10/2005  Andrews et al. ............. 257/100
2006/0076883 A1 *  4/2006  Himaki et al. ............... 313/503
2006/0243995 A1 * 11/2006  Hong et al. .................... 257/98

FOREIGN PATENT DOCUMENTS

| EP | 1 198 016 | 4/2002 |
| EP | 1 418 630 | 5/2004 |
| EP | 1 455 398 | 9/2004 |

(Continued)

*Primary Examiner*—David Vu
*Assistant Examiner*—Brandon Fox

(57) ABSTRACT

Disclosed is a semiconductor light emitting device (10) that includes an LED chip (14) mounted on a base substrate (12) and a phosphor (16) covering the LED chip (14). The LED chip (14) is substantially in the shape of a regular hexagonal prism and the phosphor (16) is substantially in the shape of a cylinder. The phosphor (16) is so disposed that the axis of the cylinder substantially coincides with the axis of the prism.

11 Claims, 15 Drawing Sheets

FOREIGN PATENT DOCUMENTS

| | | |
|---|---|---|
| JP | 10-65221 | 3/1998 |
| JP | 2002-185048 | 6/2002 |
| JP | 2004-172586 | 6/2004 |
| JP | WO2004053210 * | 6/2004 |
| WO | 2004/077580 | 9/2004 |

* cited by examiner

STEP A

STEP B

STEP C

STEP D

STEP E

STEP F

STEP G

Enlarged Portion C

STEP H

STEP J

STEP K

STEP L

STEP M

STEP N

STEP Q

SEMICONDUCTOR LIGHT EMITTING DEVICE, LIGHTING MODULE, ILLUMINATION APPARATUS, SURFACE MOUNT LED, AND BULLET LED

TECHNICAL FIELD

The present invention relates to a semiconductor light emitting device having a semiconductor light emitting element, such as a Light Emitting Diode (hereinafter, "LED") chip. The present invention also relates to a lighting module, an illumination apparatus, a surface mount LED, and a bullet LED each having the semiconductor light emitting device. More particularly, the present invention relates to a semiconductor light emitting device that produces visible light of a desired color with the use of phosphor.

BACKGROUND ART

In comparison with incandescent and halogen lamps, LEDs have higher efficiency and longer lives. With the recent increase in the intensity of white LEDs, active studies have been made for applying the white LEDs to illumination purposes. Among various point light sources, LEDs are expected, owing to their property, to replace halogen lamps which are currently widely used for spot lighting at shops, museums, and showrooms.

At present, a typical white LED is composed of an LED bare chip that emits blue light and a phosphor that emits yellow light when excited by the blue light. This combination of the LED chip and the phosphor produces white light as a result of color mixture. Generally, such a white LED composed of a bare chip and a phosphor is manufactured by mounting the bare chip on a lead frame or printed wiring board, and dropping a resin mixed with a phosphor material from above. As a result, the phosphor is formed to surround the bare chip (See, for example, JP patent No. 2998696).

Unfortunately, however, according to JP patent No. 2998696, the resulting white LEDs tend to be inconsistent in the color of white light for the following reason. Since the phosphor film of each LED is formed by dropping a resin mixed with a phosphor material onto the LED bare chip, the shape (outer shape) of each phosphor film is not consistent. As a result, the thickness of a phosphor surrounding each LED chip varies. The color temperature of white light emitted by a white LED is determined by the proportion of the amounts of blue and yellow light. When the phosphor film is thicker, less blue light is emitted, so that the proportion of yellow light increases and the resulting white light will be of a lower color temperature. Reversely, when the phosphor film is thinner, the resulting white light will be of a higher color temperature. Accordingly, the white LEDs according to JP patent No. 2998696 suffer from inconsistency in color temperatures.

JP patent application publication No. 2002-185048 discloses a technique of forming a phosphor film into a more consistent shape. According to the disclosure of JP patent application publication No. 2002-185048, after an LED bare chip is mounted on a printed wiring board, a phosphor film is formed by stencil printing. As a result, the phosphor film is formed into a uniform outer shape.

Yet, even if each phosphor film has a uniform outer shape, an LED bare chip may unintentionally rotate during a mounting process, which causes inconsistency in color of emission light. More specifically, since a phosphor film is shaped into a square conforming to a square LED chip, if the LED chip is rotated, the sides of the LED chip are no longer parallel to the sides of the phosphor film at all. As a result, the phosphor film of one LED chip is not uniform in thicknesses measured from different points on the lateral surfaces. Since the angle of such unintentional rotation differs from chip to chip, the color temperatures of white LEDs are not uniform for the same reason as described above.

In view of the above problem, JP patent application 2004-172586 discloses a white LED having a cylindrically shaped phosphor film covering a square LED bare chip. With this structure, even if the LED chip rotates, the resulting white LEDs will have a more uniform color temperature. In addition, the phosphor film will produce a beam with a circular spot profile, which is an advantageous property for use as the illumination light sources mentioned above. This property is also advantageous in optical design when used in combination with a reflector.

As the application of white LEDs to illumination purpose advances, LED chips are upsized in order for a single LED bare chip to emit more light. Conventionally, LED chips are typically 0.3 mm per side square. Now there are LED chips of 2 mm per side square.

With the technique disclosed in JP patent application 2004-172586, the difference in colors of light emitted by white LED chips is suppressed. Yet, when applying the technique to a larger-sized LED chip, the color inconsistency within a single white LED chip exceeds a maximum permissible level.

The present invention aims to provide a semiconductor light emitting device without much color inconsistency, even with a larger-sized light emitting element (LED chip). The present invention also aims to provide a lighting module, an illumination apparatus, a surface mount LED, and a bullet LED each having the semiconductor light emitting device.

DISCLOSURE OF THE INVENTION

In order to achieve the above aim, a semiconductor light emitting device according to the present invention includes: a light emitting element having a semiconductor multilayer structure that has a light emission layer and is substantially in a shape of a regular hexagonal prism; and a phosphor that is substantially in a shape of a cylinder and disposed to cover a main surface and lateral surfaces of the light emitting element.

With the structure stated above, the light emitting element is substantially in the shape of a regular hexagonal prism that is symmetrical about its center in plan view. In addition, the phosphor is in the shape of a cylinder that is also symmetrical about its center in plan view. Thus, even if the light emitting element rotates on an axis of the regular hexagonal prism, the color temperature of the semiconductor light emitting device is not seriously affected.

In addition, in comparison with a conventional semiconductor light emitting device of which light emitting element is in the shape of a quadrangular prism, provided that the size of the light emitting element (the length of polygon diameter in plan view) is equal, the semiconductor light emitting device of the present invention is smaller in color inconsistency within a single device. This is because of the following reason. According to the semiconductor light emitting device of the present invention, the difference between the thicknesses of the phosphor measured from a corner and a lateral side of the light emitting element is smaller than that of a conventional semiconductor light emitting device. That is to say, the present invention provides a semiconductor light emitting device that exhibits less color inconsistency than a conventional light emitting semiconductor device, even if the size of the semiconductor light emitting element is made larger.

BEST MODE FOR CARRYING OUT THE INVENTION

Hereinafter, a description is given to an embodiment of the present invention with reference to the drawings.

Figure 1A:
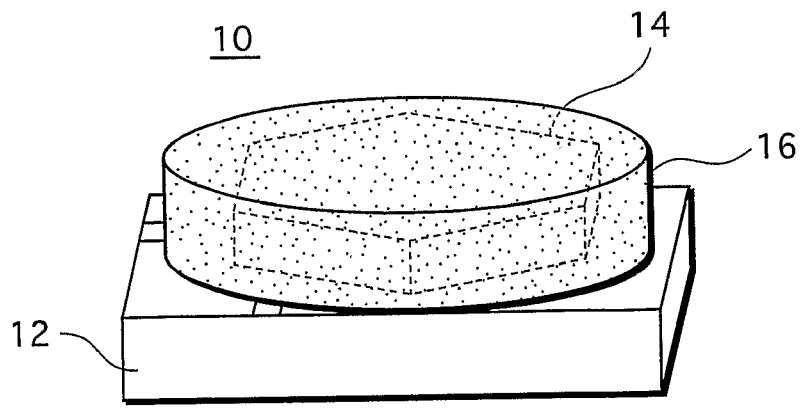
FIG. 1 are views showing a semiconductor light emitting device according to an embodiment of the present invention.
Figure 1B:
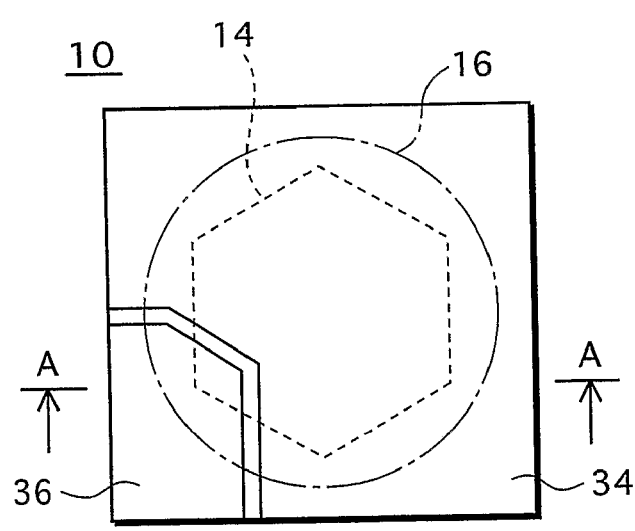
Figure 1C:
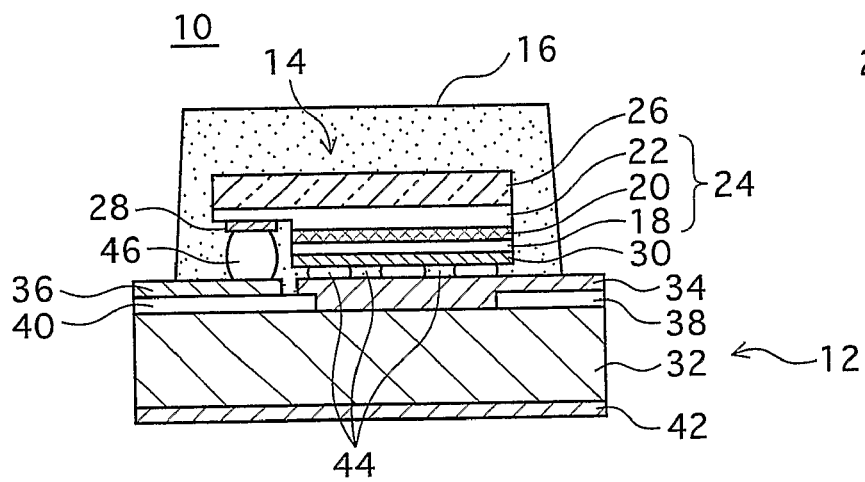

FIG. 1A is an oblique view and FIG. 1B is a plan view of a semiconductor light emitting device 10 of the embodiment. FIG. 1C is a sectional view of the semiconductor light emitting device 10 taken along the line A-A of FIG. 1B. Note that the components shown in the figures including FIGS. 1A, 1B, and 1C are not illustrated on the same scale.

As shown in FIG. 1, the semiconductor light emitting device 10 is composed of: a base substrate 12 substantially in the shape of a regular quadrangular prism; an LED chip 14 mounted on the base substrate 12; and a phosphor 16 covering the upper surface and the lateral surfaces of the LED chip 14. The LED chip 14 is cited as an example of a semiconductor light emitting element.

The LED chip 14 substantially has the outer shape of a regular hexagonal prism. The reason for this regular hexagonal prism shape will be described later.

The LED chip 14 includes a semiconductor multilayer structure (multilayer epitaxial structure) 24 that is composed of the following layers laminated over the base substrate 12 in the stated order: a p-GaN layer as a first conductive layer 18 of one conductivity type, an InGaN/GaN multiple quantum well (hereinafter "MQW") layer as a light emission layer 20, and an n-GaN layer as a second conductive layer 22 of the other conductivity type. The semiconductor multilayer structure 24 constitutes a diode. On a main surface of the semiconductor multilayer structure 24 facing away from the base substrate 12 is a single crystal substrate 26 on which the epitaxial growth took place. The single crystal substrate 26 is made of an n-GaN material having conductivity and light transmittancy.

Figure 1D:
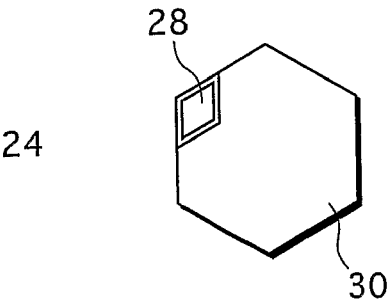

When seen the LED chip 14 from the bottom, as exclusively shown in FIG. 1D, a portion of the LED chip 14 is removed in the shape of a rhombus at one of the six corners of the semiconductor multilayer structure 24, which substantially has the shape of a regular hexagonal prism. In the laminating direction of the semiconductor multilayer structure 24, the rhombus portion extends from the first conductive layer 18 to some midpoint in the second conductive layer 22. That is, because of the removal, an area of the second conductive layer 22 is exposed in the shape of a rhombus. On the rhombus area of the second conductive layer 22, an n-electrode is formed as a second electrode 28. Over the entire surface of the first conductive layer 18 facing toward the base substrate 12, a p-electrode is formed as a first electrode 30. The second electrode 28 is a laminate of Ti/Au films, whereas the first electrode 30 is a laminate of Rh/Pt/Au films.

The base substrate 12 includes an n-Si conductive semiconductor substrate 32 (hereinafter, simply "semiconductor substrate 32"). On the upper surface of the semiconductor substrate 32, a first conductive pattern 34 and a second conductive pattern 36 are formed. Each of the first and second conductive patterns 34 and 36 is a laminate of Ti/Pt/Al films. The first conductive pattern 34 is partly insulated from the semiconductor substrate 32 by an $SiO_2$ insulating film 38 (hereinafter, "first insulating film 38"). The rest of the first conductive pattern 34 is joined to the semiconductor substrate 32 and thus electrically connected thereto. On the other hand, the second conductive pattern 36 is entirely insulated from the semiconductor substrate 32 by an $SiO_2$ insulating film 40 (hereinafter, "second insulating film 40"). Although the first and second insulating films 38 and 40 are integrally (continuously) formed, the two insulting films are distinguished from each other based on their insulating targets. A first power supply terminal 42, which is on an anode side, is formed on the entire under surface of the semiconductor substrate 32. The first power supply terminal, 42 is a laminate of Ni/Au films. With the above structure, the first, power supply terminal 42 and the first conductive pattern 34 are brought into an electrical connection via the semiconductor substrate 32.

On the base substrate 12 having the above structure, the LED chip 14 is flip-chip mounted. More specifically, the semiconductor multilayer structure 24 is faced down (the single crystal substrate 26 is faced up), and the first electrode 30 is connected to the first conductive pattern 34 via metal bumps 44 such as gold (Au). Similarly, the second electrode 28 is connected to the second conductive pattern 36 via a metal bump 46 such as gold (Au). As seen from the above mounting, the first and second conductive patterns 34 and 36 serve as pads for mounting the LED chip 14.

The outer shape of the phosphor 16 is substantially in the shape of cylinder. Strictly speaking, the phosphor 16 is substantially in the shape of a truncated cone having a tapered lateral surface, for a later-described manufacturing reason. Yet, the taper angle is extremely small, so that the phosphor 16 is regarded to be in a cylindrical shape. As shown in FIG. 1B, the central axis of the cylindrical phosphor 16 substantially coincides with the central axis of the hexagonal LED chip. The phosphor 16 is made of phosphor powders and impalpable particles of $SiO_2$ dispersed in a transparent resin, such as silicone. The phosphor powders include yellowish green phosphor powder such as $(Ba, Sr)_2SiO_4:Eu^{2+}$ or $Y_3(Al, Ga)_5O_{12}:Ce^{3+}$, and red phosphor powder such as $Sr_2Si_5N_8:Eu^{2+}$ or $(Ca, Sr)S:Eu^{2+}$.

The semiconductor light emitting device 10 having the above structure is mounted on a printed wiring board or the like to put to use. For mounting, the first power supply terminal 42 is soldered onto a mounting pad of the printed wiring board. In addition, a part of the second conductive pattern 36 exposed from the phosphor 16 is connected to another mounting pad via a bonding wire. Consequently, the second conductive pattern 36 also acts as a second power supply terminal, which is on a cathode side.

On application of an electric current to the first power supply terminal 42 and the second conductive pattern (second power supply terminal) 36, the light emission layer 20 emits blue light at a wavelength of 460 nm. Part of the blue light emitted from the light emission layer 20 travels toward the first conductive layer 18 and is reflected toward the second conductive layer 22 by the first electrode 30, which is made of a material having high reflectivity. Part of the blue light travels directly toward the second conductive layer 22. After passing through the second conductive layer 22, the blue light is partly absorbed by the phosphor 16 to be converted into yellowish green light and red light. A mixture of the blue light, the yellowish green light, and the red light produces white light. Finally, the white light exits the phosphor 16 mainly from the upper surface thereof. Similarly, blue light emitted from the light emission layer 20 in a lateral direction (blue light emitted from the lateral surfaces of the semiconductor multilayer structure 24) is partly converted by the phosphor 16 into yellowish green light and red light. A mixture of the blue light, the yellowish green light, and the red light produces white light and the white light exits the phosphor 16 mainly from the lateral surface.

Now, a discussion is given to a conventional semiconductor light emitting device composed of an LED chip substantially having the shape of a quadrangular prism and a phosphor substantially having the shape of a cylinder, as to why increase in size tends to cause color inconsistency. In addition, a discussion is give to the reason why the semiconductor light emitting device of the present embodiment exhibits less color inconsistency than such a conventional semiconductor light emitting device of a same size. In the discussions, FIG. 2 are referenced.

Figure 2A:
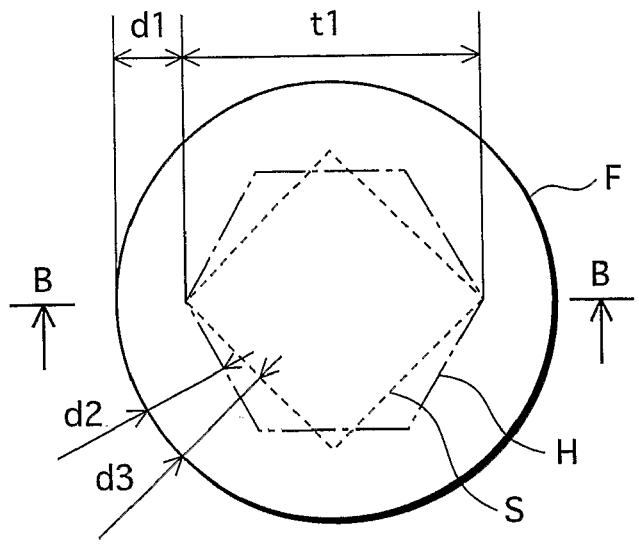
FIG. 2 are views illustrating how the ratio of a lateral thickness to a corner thickness of a phosphor changes with the size of each semiconductor light emitting device having a square LED chip or a hexagonal LED chip.
Figure 2B:
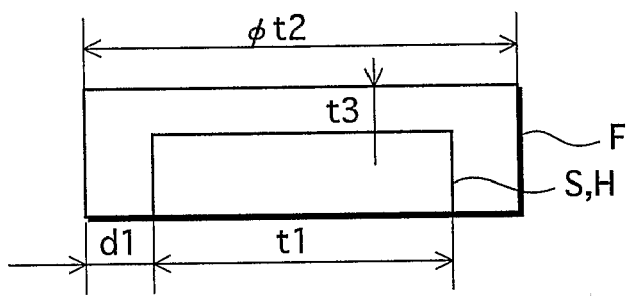

FIG. 2A is a plan view schematically and exclusively showing LED chips S and H and a phosphor F. FIG. 2B is a sectional view taken along the line B-B of FIG. 2A.

Generally, the diameter ϕt2 of the phosphor F is determined in accordance with the length of polygon diameter t1 of the LED chip S or H used to manufacture a semiconductor light emitting device. More specifically, the diameter is determined, so that the thickness d1 of the phosphor F diametrically measured from any corner of the LED chip (hereinafter, "corner thickness") is constant (ϕt2=t1+2×d1). This is in order to secure a smallest sufficient corner thinness d1 because the thickness of phosphor F is smallest at portions outside the corners of the LED chip. In this embodiment, it is determined that d1=0.5 mm. The dimensions (size) of the semiconductor light emitting device are determined in accordance with the diameter ϕt2 of the phosphor F, because the whole phosphor F constitutes the light emitting part of the semiconductor light emitting device.

The thickness of the phosphor F diametrically measured from a lateral side of the LED chip is the largest at a point on a perpendicular bisector of each side (this largest thickness is hereinafter referred to as "lateral thickness"). In FIG. 2A, the lateral thickness of the hexagonal LED chip H is denoted as d2, whereas the lateral thickness of the square LED chip S is denoted as d3. The phosphor F is uniform in thickness perpendicularly measured from any point on the upper surface. However, owing to its polygonal shape, the phosphor F is not uniform in thickness diametrically measured from a point on the lateral sides of the LED chips. The ratio of the lateral thickness to the corner thickness (d3/d1 or d2/d1) indicates the levels of thickness non-uniformity. A higher ratio indicates that the color inconsistency is more notable.

Figure 2C:
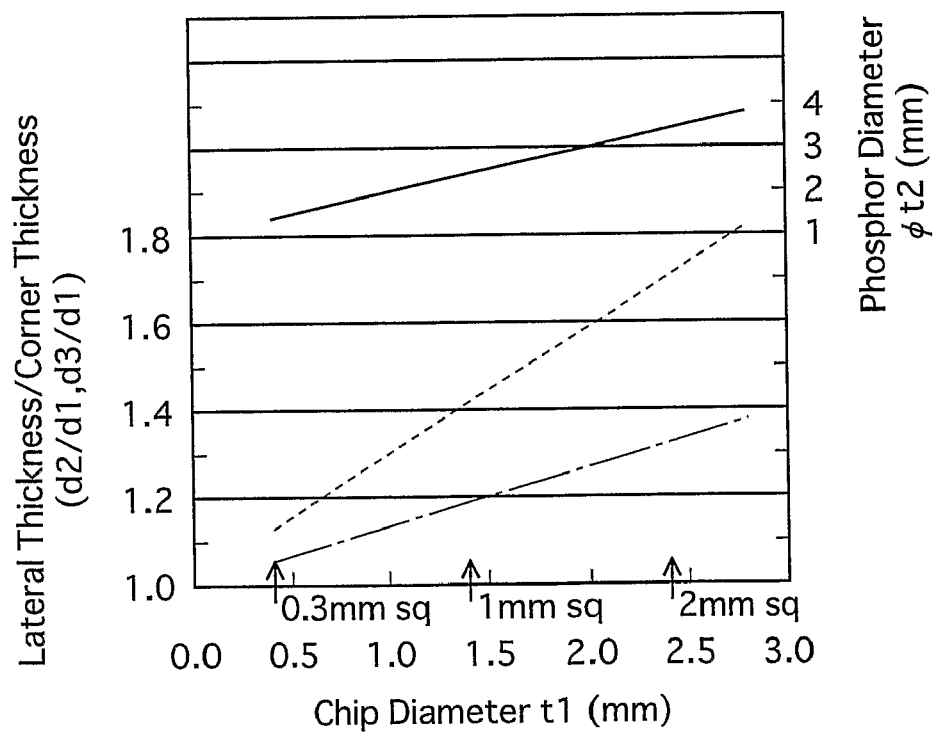

FIG. 2C shows how the ratio of the lateral thickness to the corner thickness changes with the size of semiconductor light emitting device (different phosphor diameters ϕt2).

In FIG. 2C, the solid line represents the phosphor diameters ϕt2. The broken line represents the ratios of the lateral thickness to the corner thickness (d3/d1) of the square LED chips S. The dashed lines represent the ratios of the lateral thickness to the corner thickness (d2/d1) of the hexagonal LED chips H.

As shown in FIG. 2C, as the size of the semiconductor light emitting device (phosphor diameter ϕt2) increases, the square LED chips undergo increase in the ratios of lateral thickness to the corner thickness, more steeply than that of the hexagonal chips. This means that the square LED chips are assumed to exceed the maximum permissible level of color inconsistency, while the hexagonal LED chips of the same size do not.

Here, the square LED chips S and hexagonal LED chip H having the polygon diameters t1=0.43 mm, 1.4 mm, and 2.8 mm were examined to observe the color inconsistencies. Note that d1=0.5 mm in each LED chip.

Figure 3A:
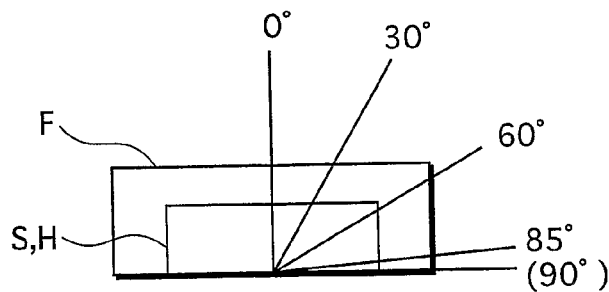
FIG. 3 are views illustrating the color temperature variations between a corner portion and a lateral portion of a square LED chip and of a hexagonal chip.
Figure 3B:
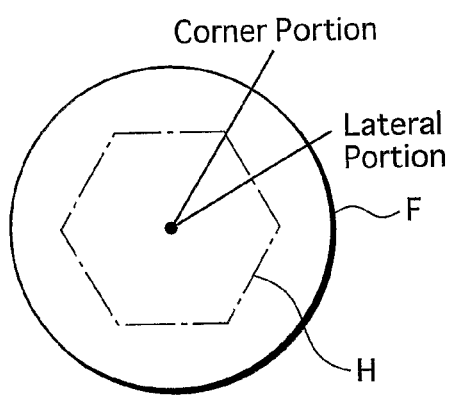
Figure 3C:
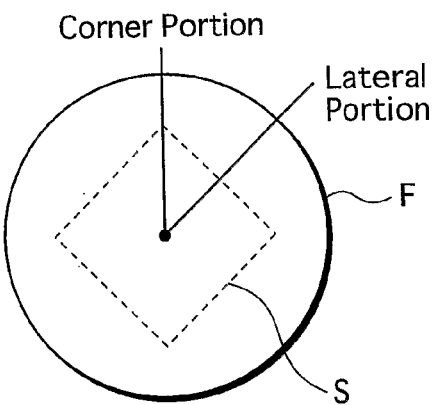

As shown in FIG. 3A, each of the LED chips S and H of various sizes were tested to measure color temperatures (K) of light emitted at 30°, 60°, and 85° with respect to the optical axis (0° axis). The measurements were made in order to see the variation between the color temperatures of a corner portion and a lateral portion of each LED chip.

Figure 3D:
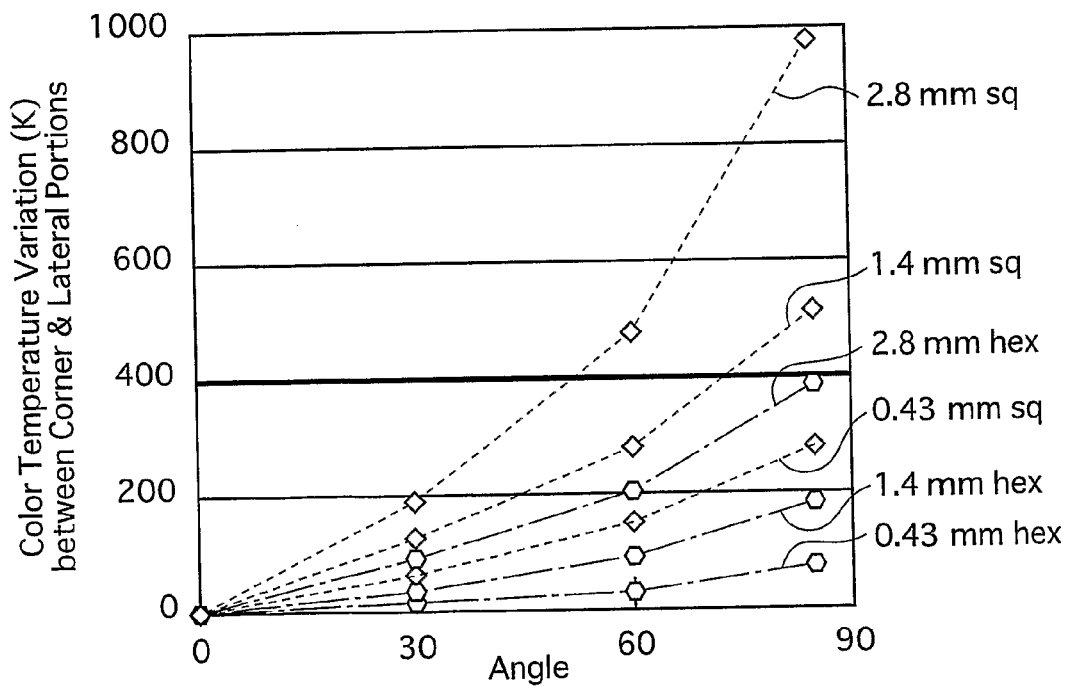

FIG. 3D shows the measurement results. In FIG. 3D, the broken lines represent the color temperature variations measured on the square LED chips S, whereas the dashed lines represent the color temperature variations measured on the hexagonal LED chips H. The color temperature variation indicating the maximum permissible level of color inconsistency is 400 K. Generally, human eyes are said to perceive the color inconsistency if the color temperature variation exceeds 400 K. If the color temperature variation is 400 K or lower, the color inconsistency is not perceivable by human eyes.

As is seen from FIG. 3D, if the polygon diameter is 1.4 mm or longer, the square LED chip S exhibits the color temperature variation exceeding 400 K, thereby exceeding the maximum permissible level of color inconsistency. On the other hand, in the case of hexagonal LED chip H, the color temperature variation is maintained within the maximum permissible level even with the polygon diameter of 2.8 mm. That is, the semiconductor light emitting device of the present embodiment is advantageous especially with the polygon diameter of at least 1.4 mm, with which a conventional semiconductor light emitting device exceeds the maximum permissible level of color inconsistency. Even if the polygon diameter is less than 1.4 mm, the semiconductor light emitting device (hexagonal LED chip) of the present embodiment is still advantageous over a conventional semiconductor light emitting device (square LED chip) of a same size in that the color inconsistency (color temperature variation) is smaller.

Next, a description is given to a manufacturing method of the semiconductor light emitting device 10 according to the embodiment, with reference to FIGS. 4-8. In FIGS. 4-8, the materials of the components of the semiconductor light emitting device 10 are denoted by reference numbers in the one thousands and its last two digits correspond to the reference numbers denoting the respective components.

Figure 4:
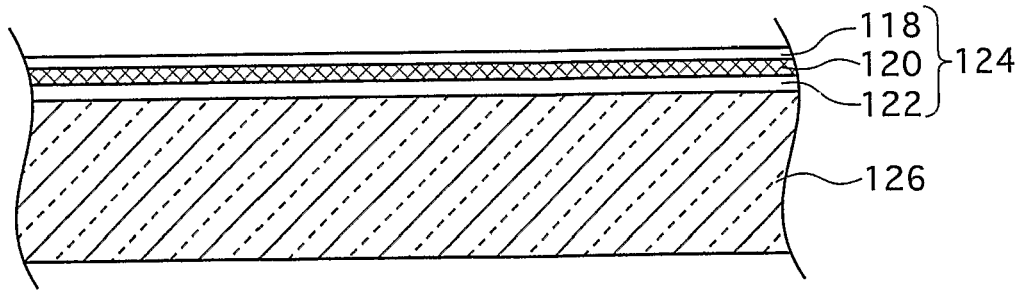
FIG. 4 is a view showing some of the processing steps of manufacturing the semiconductor light emitting device according to the embodiment.
Figure 4:
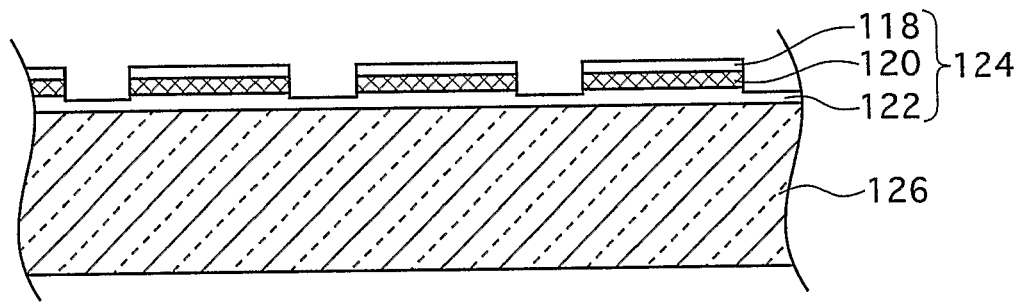
Figure 4:
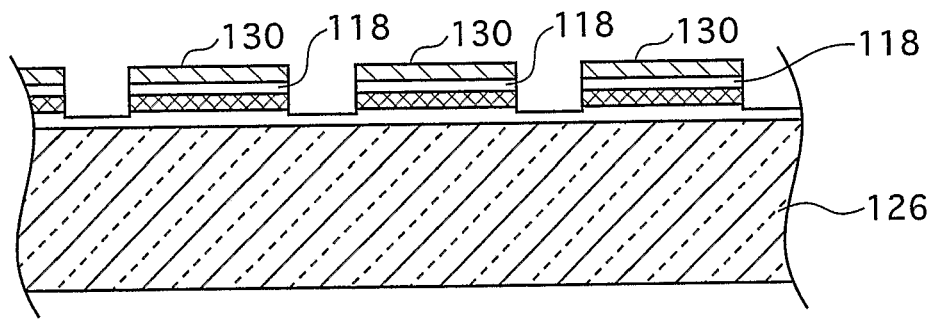
Figure 4:
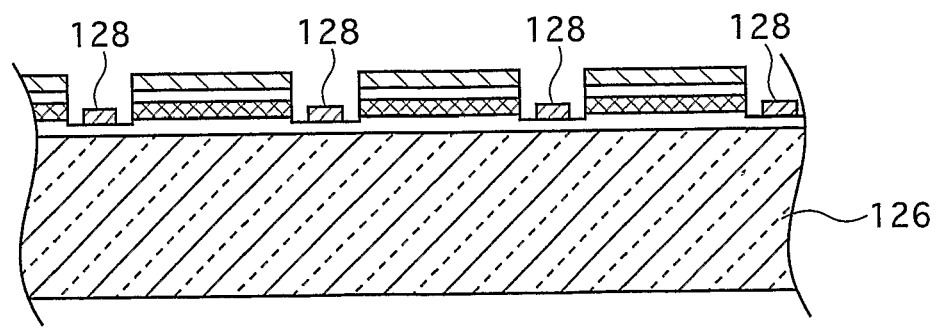

First, as shown in FIG. 4, a semiconductor multilayer structure 124 is formed by epitaxially growing the following layers in the stated order over the (0001) surface of an N-GaN single crystal substrate 126 by MOCVD (Metal Organic Chemical Vapor Deposition) method (Step A). That is, an n-GaN layer 122 which will later constitute the second conductive layer 22 (FIG. 1), an InGaN/GaN MQW light emission layer 120 which will later constitute the light emission layer 20 (FIG. 1), a p-GaN layer 118 which will later constitute the first conductive layer 18 (FIG. 1) are laminated. The single crystal substrate may alternatively be a sapphire substrate or a conductive 4H-SiC substrate.

In order to create the area (the rhombus area) for forming the second electrode 28 (FIG. 1), part of the n-GaN layer 122, InGaN/GaN MQW light emission layer 120, and p-GaN layer 118 is removed by, for example, dry etching (Step B).

Next, a laminate 130 of Rh/Pt/Au films is formed on the upper surface of the p-GaN layer 118 by electron beam evaporation, for example (Step C). The Rh/Pt/Au film laminate 130 will later constitute the first electrode 30 (FIG. 1).

On the rhombus area, a laminate 128 of Ti/Au films, which will later constitute the second electrode 28 (FIG. 1) is formed (Step D).

Figure 5:
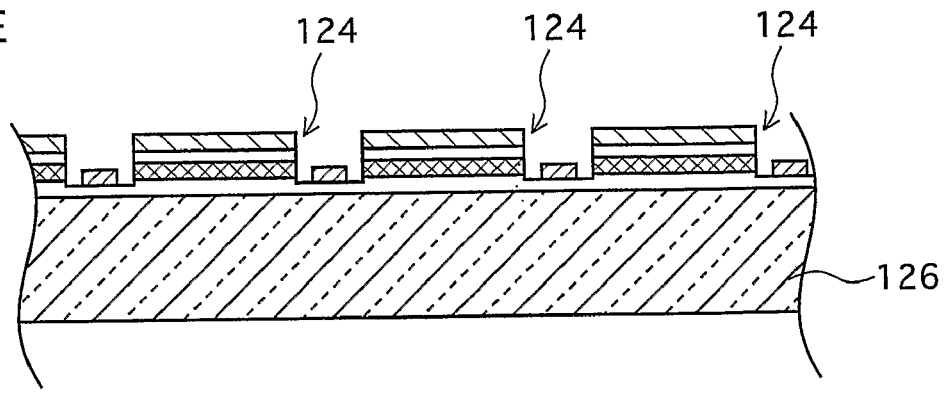
FIG. 5 is a view showing some of the processing steps of manufacturing the semiconductor light emitting device according to the embodiment.
Figure 5:
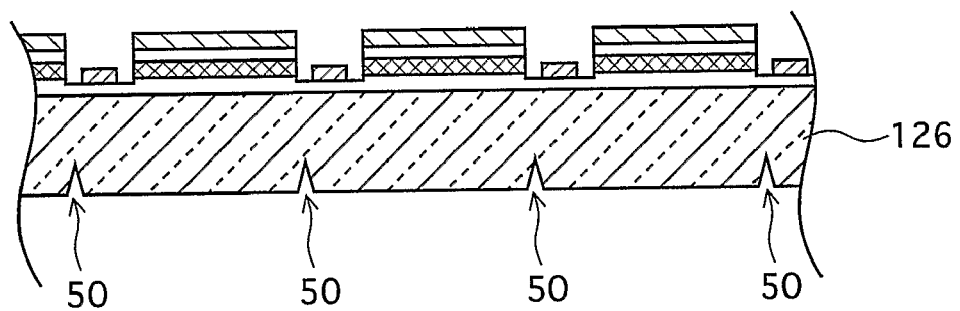
Figure 5:
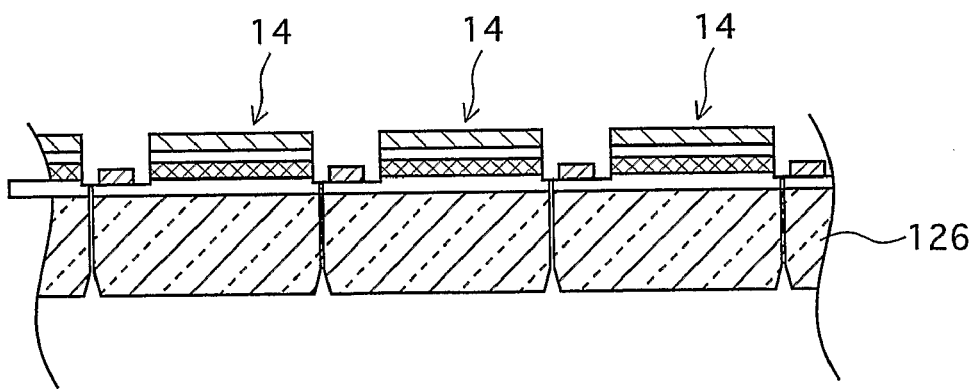

Referring now to FIG. 5, the surface of the single crystal substrate 126 facing away from the semiconductor multilayer structure 124 is ground by, for example, mechanical girding, until the thickness reaches 200 µm or so (Step E)

Guide grooves 50 for cleaving are formed in the ground surface of the single crystal substrate 126 by, for example, dry etching (Step F). The steps F and G will be described later in more detail.

Along the guide grooves 50, the single crystal substrate 126 is cleaved into pieces, whereby LED chips 14 are obtained (Step G).

In the above steps F and G, the single crystal substrate is split along the crystallographic planes and thus into LED chips each substantially having a shape of regular hexagonal prism. Since this process of cleaving is disclosed in JP patent application publication No. 11-340507, the description is given only briefly with reference to FIG. 6.

Figure 6A:
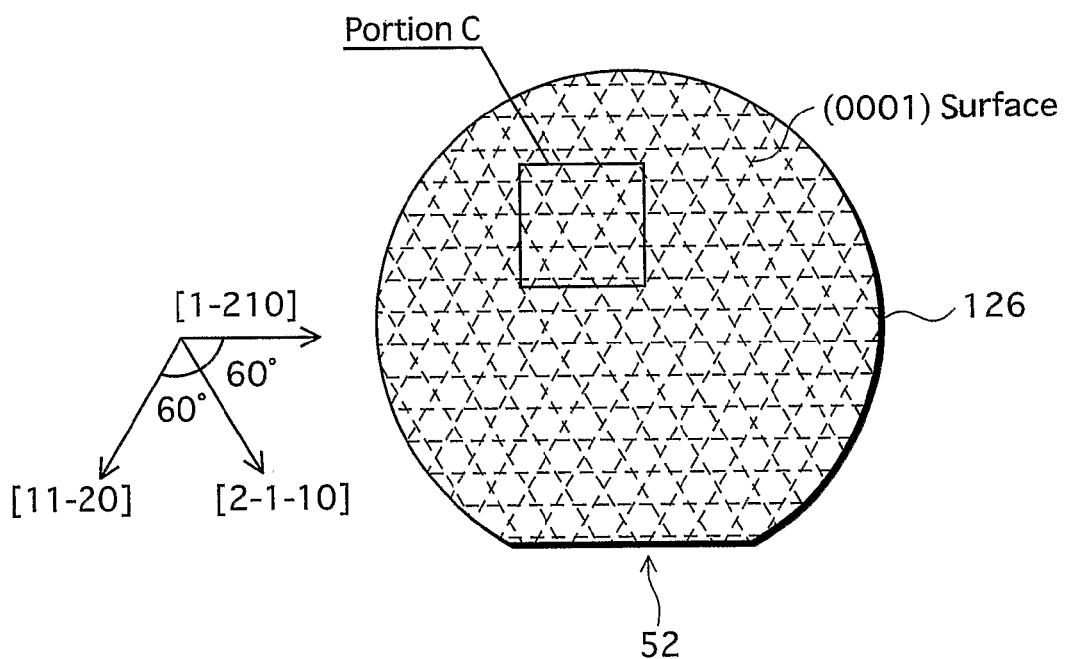
FIG. 6 are views showing some of the processing steps of manufacturing the semiconductor light emitting device according to the embodiment.

As shown in FIG. 6A, the hexagonal system single crystal substrate 126, such as GaN or 4H-SiC, having the (0001) main surface can be cleaved along the [1-210], [2-1-10], and [11-20] orientations. One of the crystallographic orientations coincides with the orientation flat 52 of the single crystal substrate. For example, in the case where the [1-210] orientation is parallel to the orientation flat 52, the [2-1-10] orientation extends at 60° to the orientation flat 52, and the [11-20] orientation extends at 120° to the orientation flat 52.

Figure 6B:
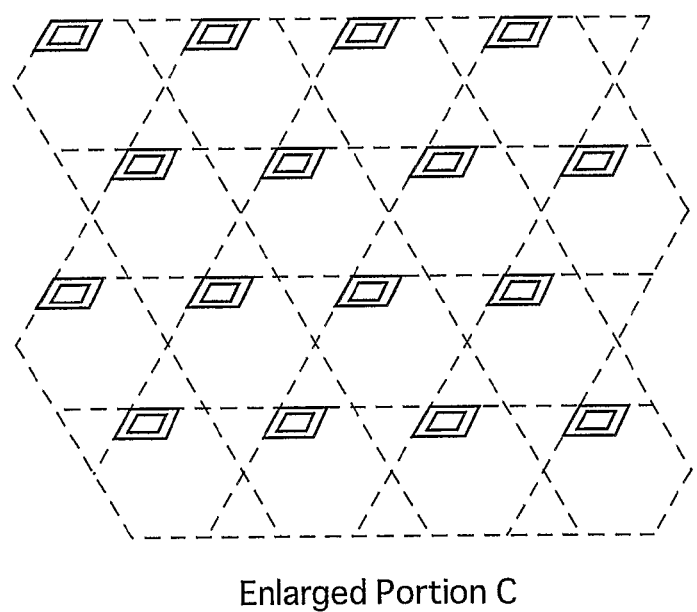

In view of the above crystal structure, the guide grooves 50 (FIG. 5, Step F) are formed along the [1-210], [2-1-10], and [11-20] orientations indicated by doted lines in FIGS. 6A and 6B. With the guide grooves 50, the single crystal substrate 126 is partitioned into hexagonal areas. By cleaving along the guide grooves 50, the single crystal substrate 126 is divided into separate LED chips. Because of the cleaving along the crystallographic planes, chipping and cracking of the semiconductor multilayer structure are suppressed. Occurrences of chipping and cracking adversely influence the hexagonal shape of semiconductor multilayer structure. In addition, the leak current tends to increase, which adversely affect the reliability.

Figure 7:
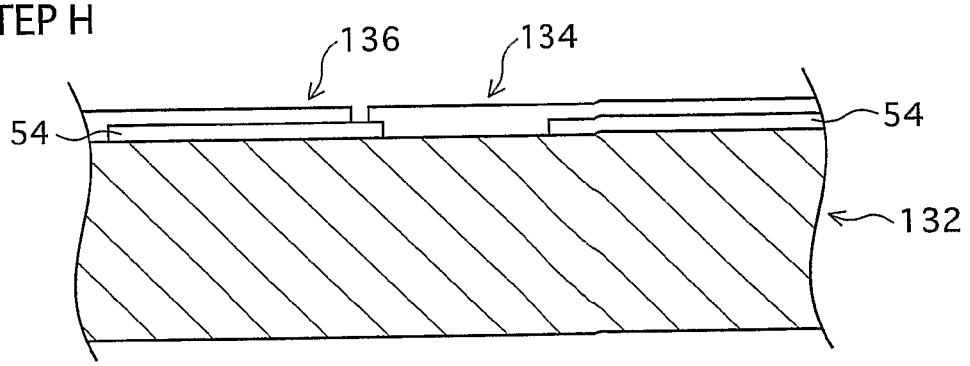
FIG. 7 is a view showing some of the processing steps of manufacturing the semiconductor light emitting device according to the embodiment.
Figure 7:
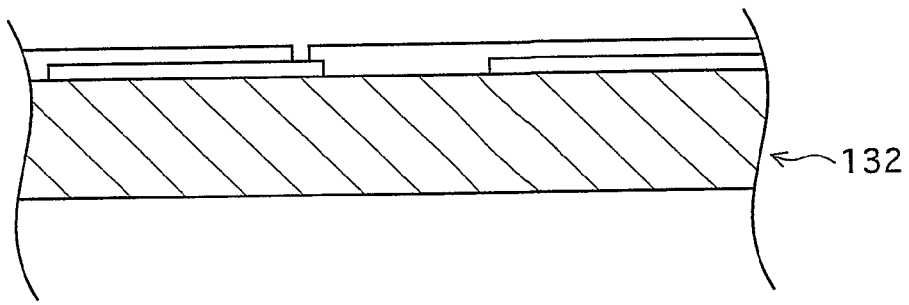
Figure 7:
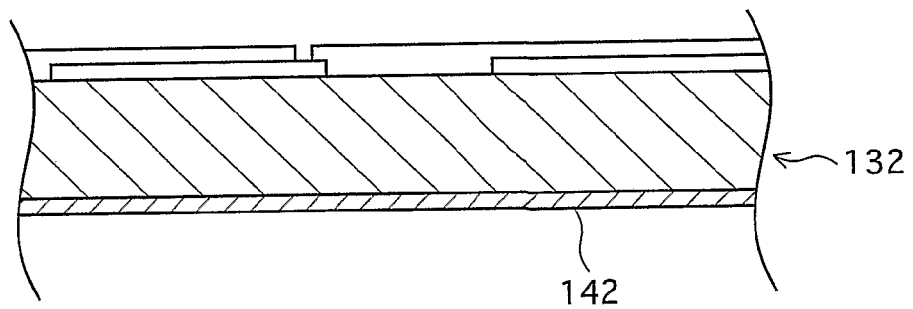
Figure 7:
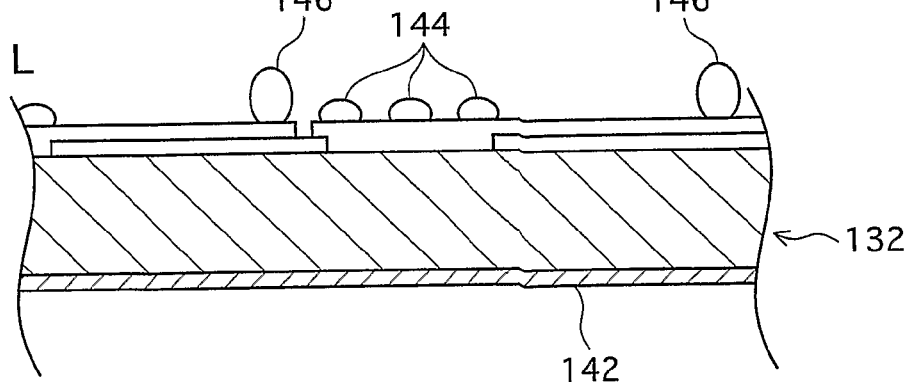
Figure 8:
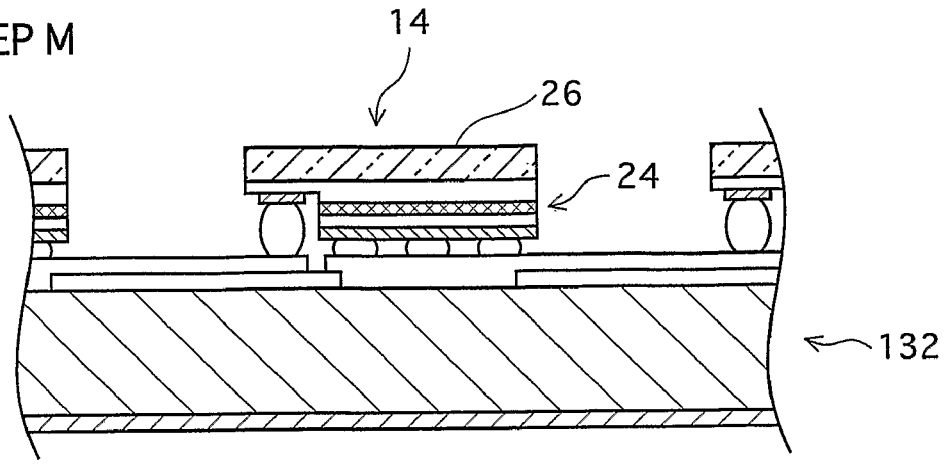
FIG. 8 is a view showing some of the processing steps of manufacturing the semiconductor light emitting device according to the embodiment.
Figure 8:
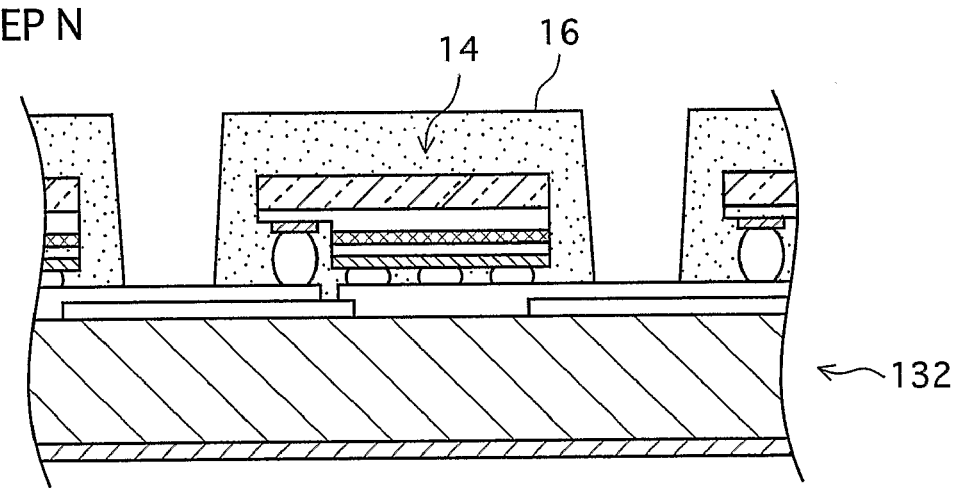
Figure 8:
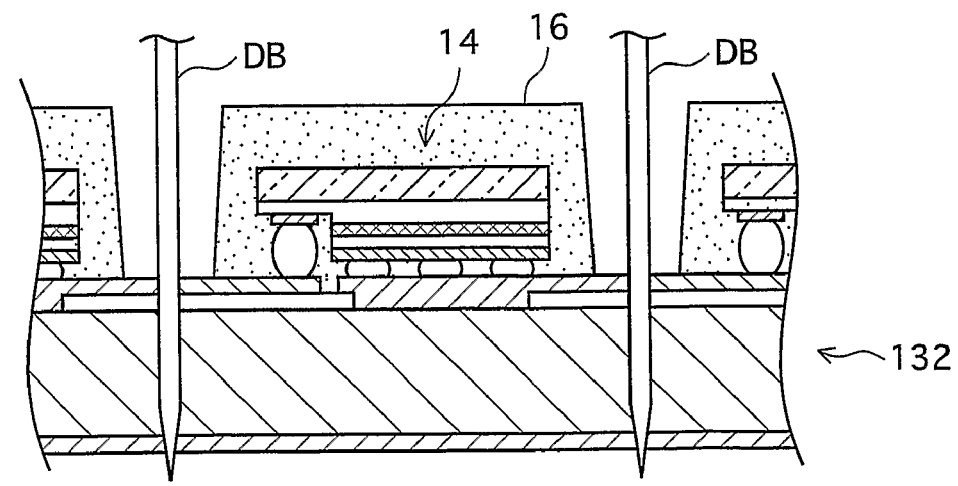

Now, with reference to FIGS. 7 and 8, a description is given to the processes of manufacturing the base substrate 12 (FIG. 1) and of mounting the LED chip 14 (FIG. 1) onto the base substrate 12.

First, as shown in FIG. 7, conductive patterns 134 and 136 are formed over one main surface an n-Si conductive semiconductor substrate 132 having an $SiO_2$ insulating layer 54 on the same main surface. The $SiO_2$ insulating layer 54 will later constitute the first and second insulating films 38 and 40 (FIG. 1). Then, part of the insulating layer 54 is removed by, for example, wet etching (Step H). As a result, the conductive pattern 134 is partly brought into an electrical connection with the conductive semiconductor substrate 132. Now, the conductive patterns 134 and 136 constitute the first and second conductive patterns 34 and 36 (FIG. 1), respectively.

The other main surface of the conductive semiconductor substrate 132 is ground to the thickness of 150 µm or so, by, for example, mechanical grinding (Step J).

On the ground surface, a laminate 142 of Ni/Au films are formed by, for example, plating (Step K). The Ni/Au film laminate will later constitute the first power supply terminal 42 (FIG. 1).

Next, Au bumps 144 and 146 are formed at predetermined locations on the conductive patterns 134 and 136, respectively (Step L).

The LED chip 14 is mounted over the conductive semiconductor substrate 132 (Step M).

Next, the phosphor particles dispersed in a silicone resin is applied by, for example, screen printing, so as to entirely cover the LED chip 14, and then the rein is thermally cured to constitute the phosphor 16 (Step N). Because of the draft angle of a screen used in the screen printing, the phosphor 16 is substantially formed into the shape of a truncated cone.

The conductive semiconductor substrate 132 is cut into pieces with a dicing blade DB. Each piece constitutes a finished semiconductor light emitting device 10 (step Q).

Figure 9:
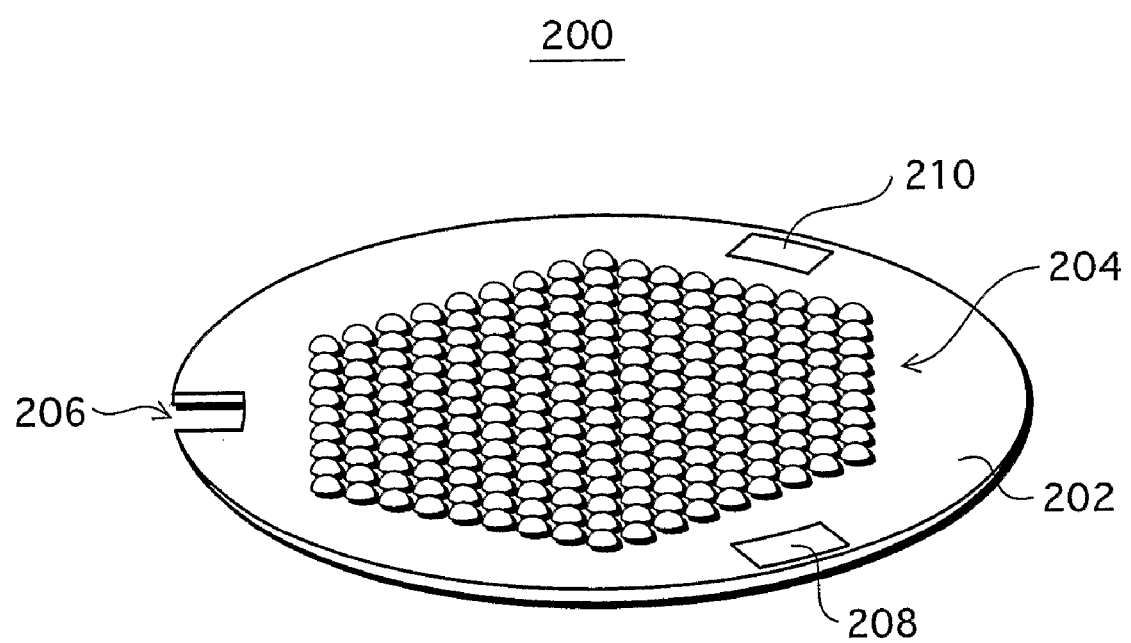
FIG. 9 is an oblique view of a while LED module according to the embodiment.

FIG. 9 is an external oblique view of a while LED module (hereinafter, simply "LED module") 200, which is a lighting module having the semiconductor light emitting device 10 (see FIG. 1). The LED module 200 is mounted to a later-described lighting fixture 232 (FIG. 12) when put to use.

The LED module 200 includes 217 resin lenses 204 and a circular ceramic substrate 202 which measures 5 cm in diameter and made of AlN (aluminum nitride). In addition, the ceramic substrate 202 is provided with a guide notch 206 and terminals 208 and 210 for power supply from the lighting fixture 232.

Figure 10A:
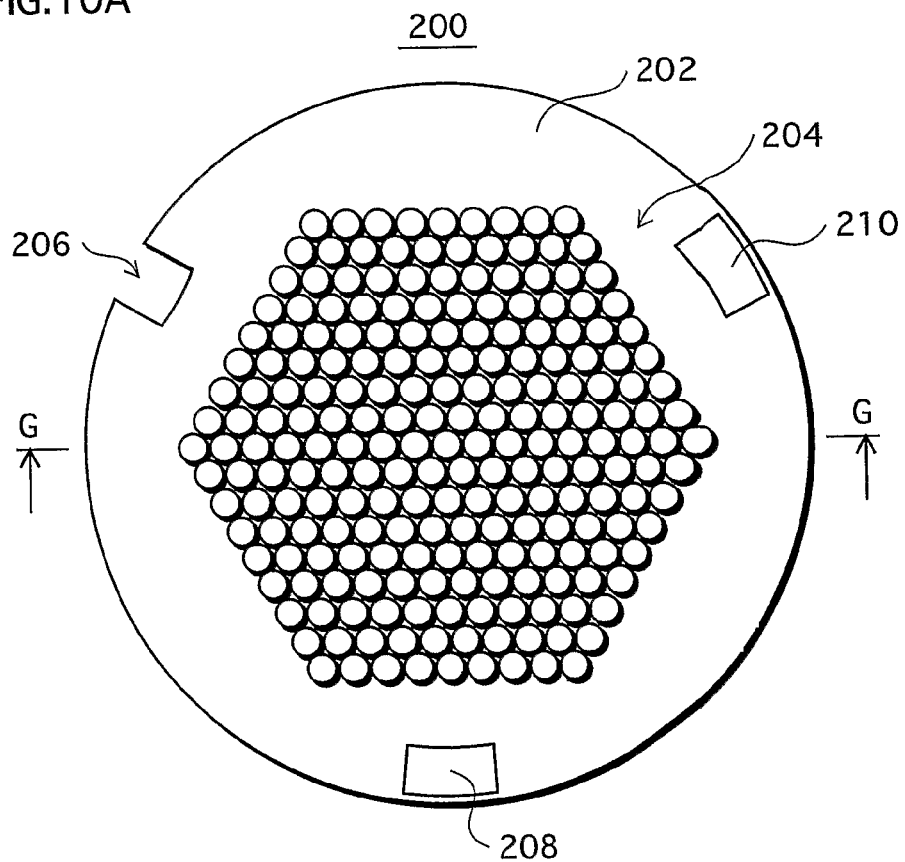
FIG. 10A is a plan view of the white LED module.
Figure 10B:
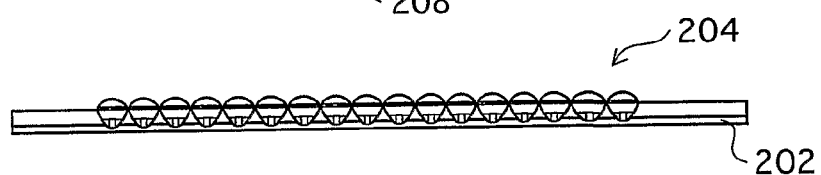
FIG. 10B is a sectional view taken along the line G-G of FIG. 10A.
Figure 10C:
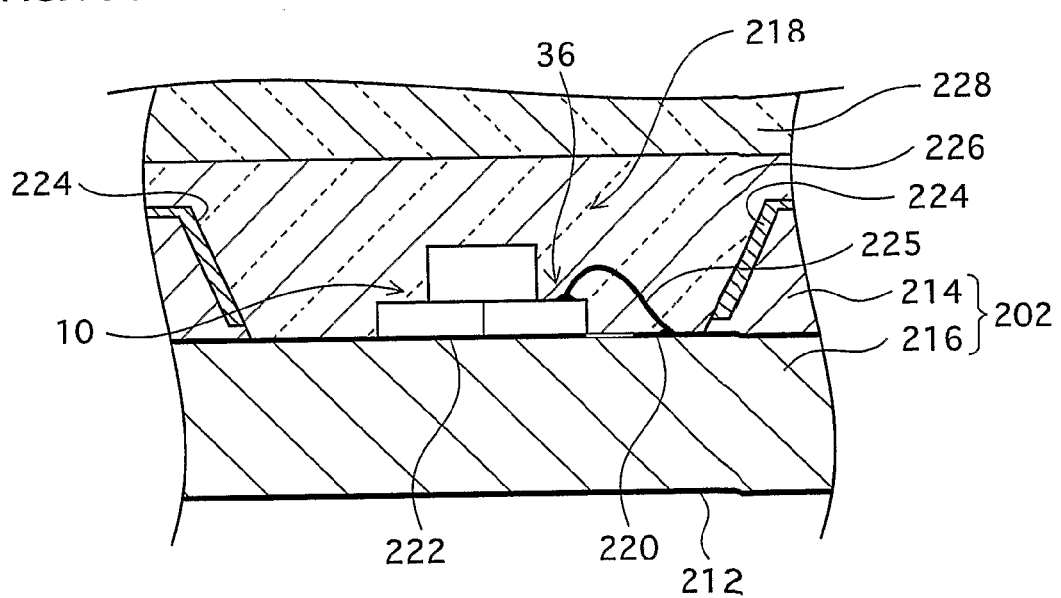
FIG. 10C is an enlarged view showing a mounting portion of the semiconductor light emitting device.

FIG. 10A is a plan view of the LED module 200, whereas FIG. 10B is a sectional view taken along the line G-G of FIG. 10A. FIG. 10C is an enlarged view showing a mounting portion of the semiconductor light emitting device 10.

As shown in FIG. 10C, the undersurface of the ceramic substrate 202 is covered with gold plating 212 in order to improve thermal dissipation.

The semiconductor light emitting devices 10 (numbering 217 in total) are mounted on the ceramic substrate 202 each at a location corresponding to the center of a respective lens illustrated as a circle in FIG. 10A.

The ceramic substrate 202 is a laminate of two ceramic substrates 214 and 216 each of which is 0.5 mm thick and made mainly of AlN. Alternatively to AlN, the ceramic substrates 214 and 216 may be made of various materials including $Al_2O_3$, BN, MgO, ZnO, SiC, and diamond.

The semiconductor light emitting devices 10 are mounted on the ceramic substrate 216, which is the lower layer. The ceramic substrate 214, which is the upper layer, is provided with downwardly tapered through-holes 218 for securing mounting space of the semiconductor light emitting devices 10.

Figure 11A:
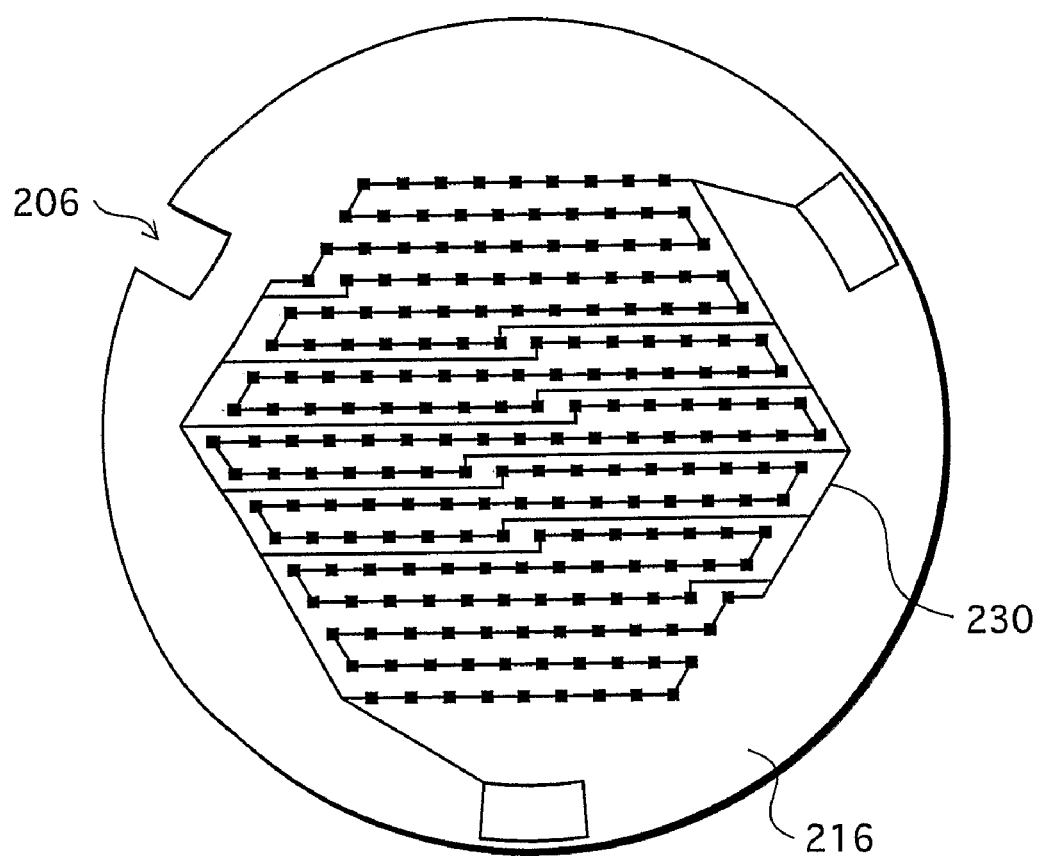
FIG. 11A is a view showing a wiring pattern of the white LED module.
Figure 11B:
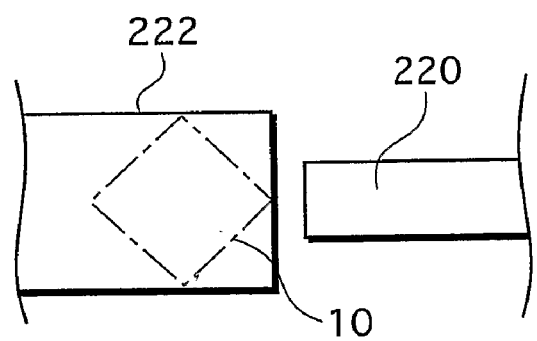
FIG. 11B is a view showing the pad pattern formed on a ceramic substrate of the white LED module.

The ceramic substrate 216 has, on the upper surface thereof, pairs of a cathode pad 220 and an anode pad 222, which are bonding pads as shown in FIG. 11B. Each pair of pads is located correspondingly to the mounting locations of the semiconductor light emitting devices 10. Each of the pads 220 and 222 is made of Cu plated with Au, and soldered with PbSn to the first power supply terminal 42 of the semiconductor light emitting device 10 (see FIG. 1).

Alternatively, the first power supply terminal 42 of the semiconductor light emitting device 10 may be further plated with a PbSn solder. This arrangement eliminates the step of putting as older on the pad 222. After placing the semiconductor light emitting devices 10 one on each pad 222, the ceramic substrate 202 is heated in are flow furnace until the temperature of the ceramic substrate reaches a melting point of the solder. In this manner, the 217 semiconductor light emitting devices 10 are soldered all at once. The reflow soldering is duly carried out by optimizing conditions, such as the shape of pads, the amount of solder, the shape of supply terminals of the semiconductor light emitting device 10, although the conditions are not specifically mentioned herein. Alternatively to the solder, a silver paste or a bump may be used for bonding. Then, the second power supply terminal 36 (FIG. 1) and the cathode pad 220 are connected with a bonding wire 225.

The semiconductor light emitting devices 10 ready for mounting are the ones already passed tests on optical properties, such as color inconsistencies and color temperatures. That is to say, according to the present embodiment, each semiconductor light emitting device 10 is already provided with a phosphor film and thus produces white light. Consequently, it is possible to test the optical properties of the semiconductor light emitting device 10 before mounting. As a result, it is prevented that an LED module is rejected (as a nonconforming product) because of insufficient optical properties. Thus, manufacturing yields of finished products (LED module) improve.

As shown in FIG. 10C, an aluminum reflecting film 224 coats the side walls of each through-hole 218 formed through the upper ceramic substrate 214. The aluminum reflecting film 224 also coats the upper surface of the ceramic substrate 214.

After mounting each semiconductor light emitting device 10 onto the ceramic substrate 216, the semiconductor light emitting device 10 is covered with a first resin 226, such as silicon. Then, a lens 204 is formed by injection molding a second resin 228, such as epoxy. It is also applicable to form the lens 204 by molding epoxy resin alone without silicon resin.

The 217 semiconductor light emitting devices 10 are connected in a 31 series×7 parallel arrangement by a wiring pattern 230 formed on the upper surface of the ceramic substrate 216.

FIG. 11A is a plan view of the LED module 200 without the lenses 204 and the upper ceramic substrate 214. A teach mounting location of the semiconductor light emitting devices 10, a pair of the anode pad 222 and the cathode pad 220 is provided as mentioned earlier (FIG. 11B).

The wiring pattern 230 connects the anode pads 222 and the cathode pads 220 bonded to the respective semiconductor light emitting devices 10 in a manner that there are seven groups of 31 serially connected semiconductor light emitting devices 10 and that the groups of semiconductor light emitting devices are connected in parallel. One end of the wiring pattern 230 is connected to the positive terminal 208 shown in FIG. 10A via a plated-through-hole (not illustrated), and the other end is connected to the negative terminal 210 also shown in FIG. 10A via a plated-through-hole (not illustrated).

The LED module 200 having the above structure is fixed to the lighting fixture 232 when put to use. The LED module 200 and the lighting fixture 232 together constitute an illumination apparatus 234.

Figure 12A:
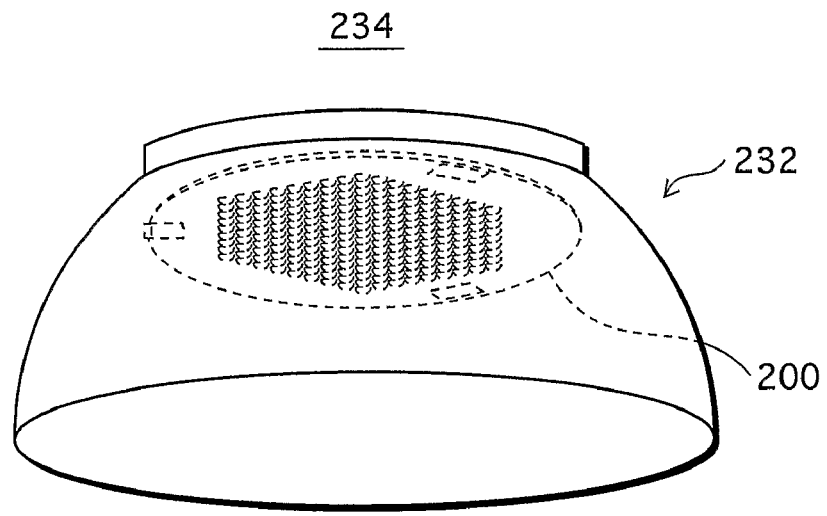
FIG. 12A is an oblique view of an illumination apparatus according to the embodiment.
Figure 12B:
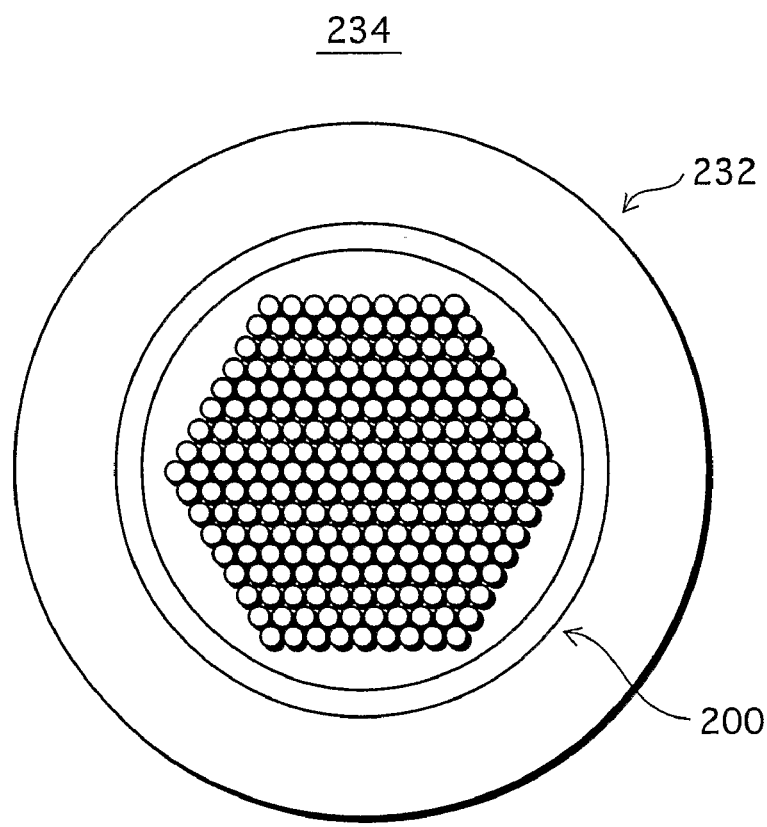
FIG. 12B is a bottom view of the illumination apparatus.

FIG. 12A is a schematic oblique view of the illumination apparatus 234, whereas FIG. 12B is a bottom view of the illumination apparatus 234.

The lighting fixture 232 is fixed in a ceiling of a room, for example. The lighting fixture 232 is provided with an electric circuit (not illustrated) for converting an alternating current from a commercial power source (for example, 100 V, 50/60 Hz) to a direct current required to drive the LED module 200.

Figure 13:
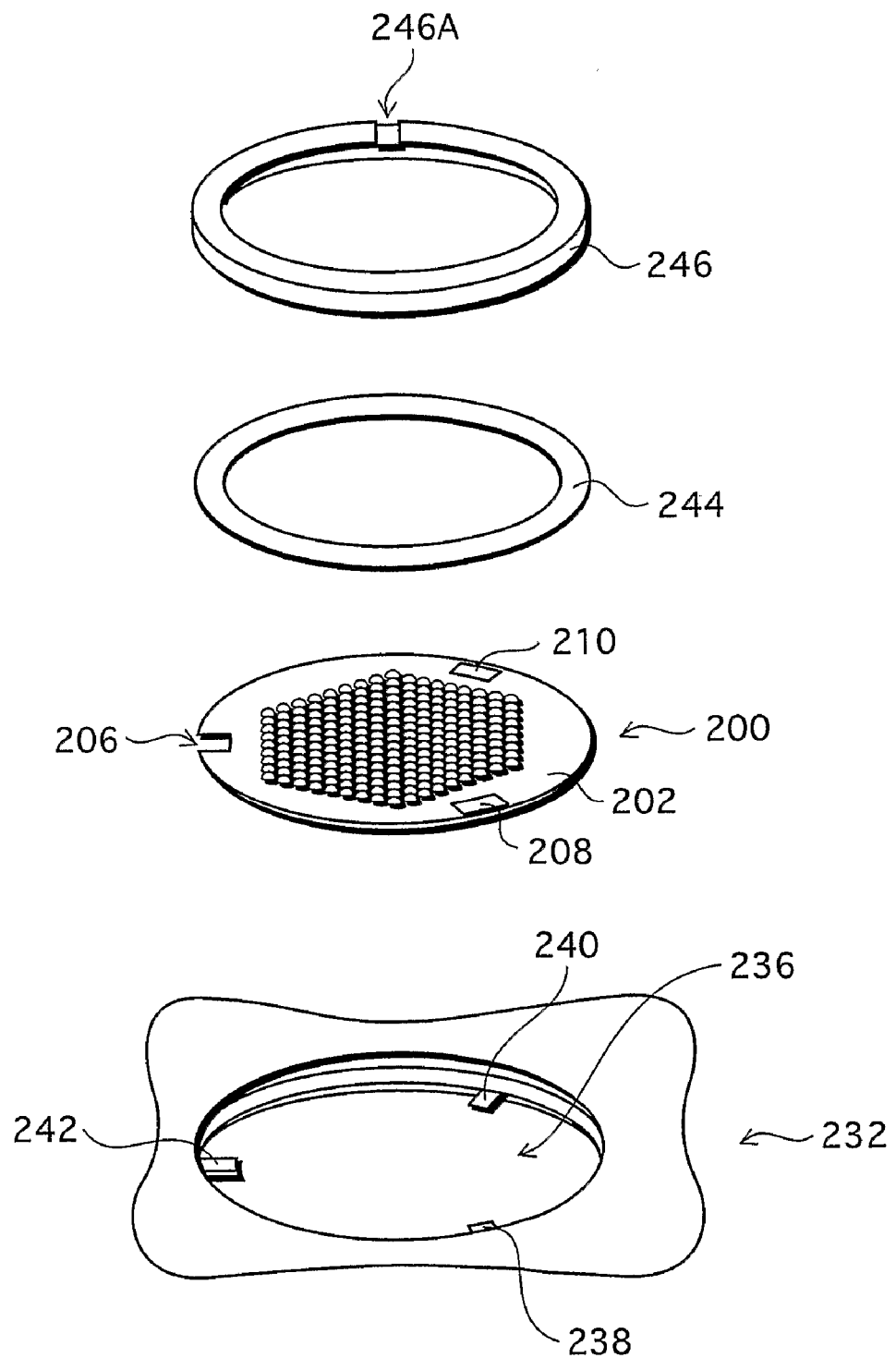
FIG. 13 is an exploded oblique view of the illumination apparatus.

With reference to FIG. 13, a description is given to the structure for attaching the LED module 200 to the lighting fixture 232.

The lighting fixture 232 has a circular recess 236 for fitting the LED module 200 therein. The circular recess 236 has a flat bottom and an inner wall that is internally threaded (not illustrated) at a portion adjacent its opening. The lighting fixture 232 also has supply terminals 238 and 240 and a guide pawl 242 all of which have flexibility and inwardly project from points on the inner wall between the threaded portion and the bottom. The supply terminal 238 is a positive terminal, whereas the supply terminal 240 is a negative terminal.

For attachment of the LED module 200 to the lighting fixture 232, there are provided an O-ring 244 made of silicon rubber and a ring screw 246. The ring screw 246 is substantially rectangular in cross section and has an externally threaded outer surface (not illustrated). In addition, the ring screw 246 has a notch 246A in the circumferential direction.

Now, a description is given to an attachment procedure.

First, the LED module 200 is fit into the circular recess. At the time of fitting, the LED module 200 is so positioned that the ceramic substrate 202 comes between the bottom surface and the supply terminals 238 and 240, and that the guide notch 206 engages with the guide pawl 242. Through the engagement between the guide notch 206 and the guide pawl 242, the supply terminals 238 and 240 are properly positioned relatively to the positive terminal 208 and the negative terminal 210.

After the LED module 200 is fit, the O-ring 244 is placed and the ring screw 246 is screwed into the circular recess 236 to secure the ring screw 246 in place. As a result, the positive terminal 208 and the negative terminal 210 come into intimate contact with the supply terminals 238 and 240, respectively, thereby reliably establishing electrical connection. In addition, the substantially entire surface of ceramic substrate 202 is brought into intimate contact with the flat bottom surface of the circular recess 236. Thus, heat generated by the LED module 200 is effectively conducted to the lighting fixture 232, thereby improving cooling effect of the LED module 200. To further improve the heat conductivity, silicone grease may be applied to the ceramic substrate 202 and the bottom surface of the circular recess 236.

On application of an electric current from a commercial power source to the illumination apparatus 234 having the above structure, the semiconductor light emitting devices 10 emit white light through the lenses 204.

FIG. 14 show a surface mount LED (SMD) 300 (hereinafter, simply "LED 300") having the semiconductor light emitting device 10 (FIG. 1).

Figure 14A:
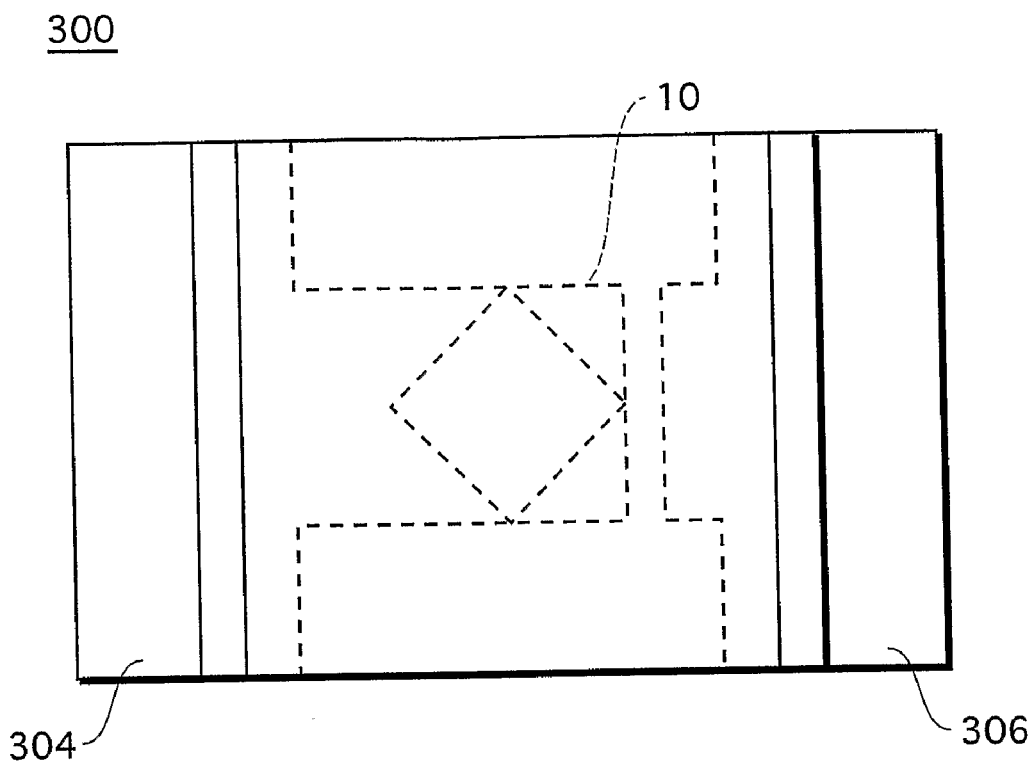
FIG. 14A is a plan view of a surface mount LED according to the embodiment.
Figure 14B:
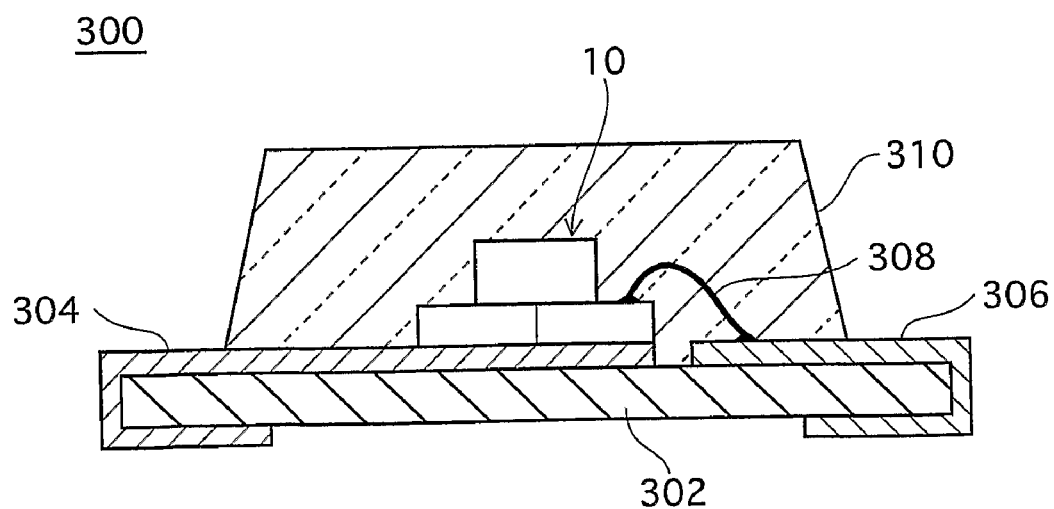
FIG. 14B is a longitudinal sectional view of the surface mount LED (the semiconductor light emitting device is not sectioned)

FIG. 14A is a plan view and FIG. 14B is a longitudinal sectional view of the LED 300 (the semiconductor light emitting device 10 is not sectioned).

The LED 300 is composed of a ceramic substrate 302 having a rectangular plate-like shape, and a pair of power supply terminals 304 and 306 disposed one on each main surface of the ceramic substrate 302.

The semiconductor light emitting device 10 is mounted on the upper surface of the supply terminal 304. Consequently, the power supply terminal 304 is physically and electrically connected to the first power supply terminal 42 (FIG. 1) of the semiconductor light emitting device 10. The power supply terminal 306 is electrically connected, via a bonding wire 308, to the second power supply terminal 36 (FIG. 1) of the semiconductor light emitting device 10. The semiconductor light emitting device 10 is sealed with an epoxy resin 310, which is a sealing material.

Upon application of an electric current to the LED 300 having the above structure via the power supply terminals 304 and 306, the semiconductor light emitting device 10 emits white light. The white light passes through the film of the epoxy resin 310 toward outside.

Figure 15:
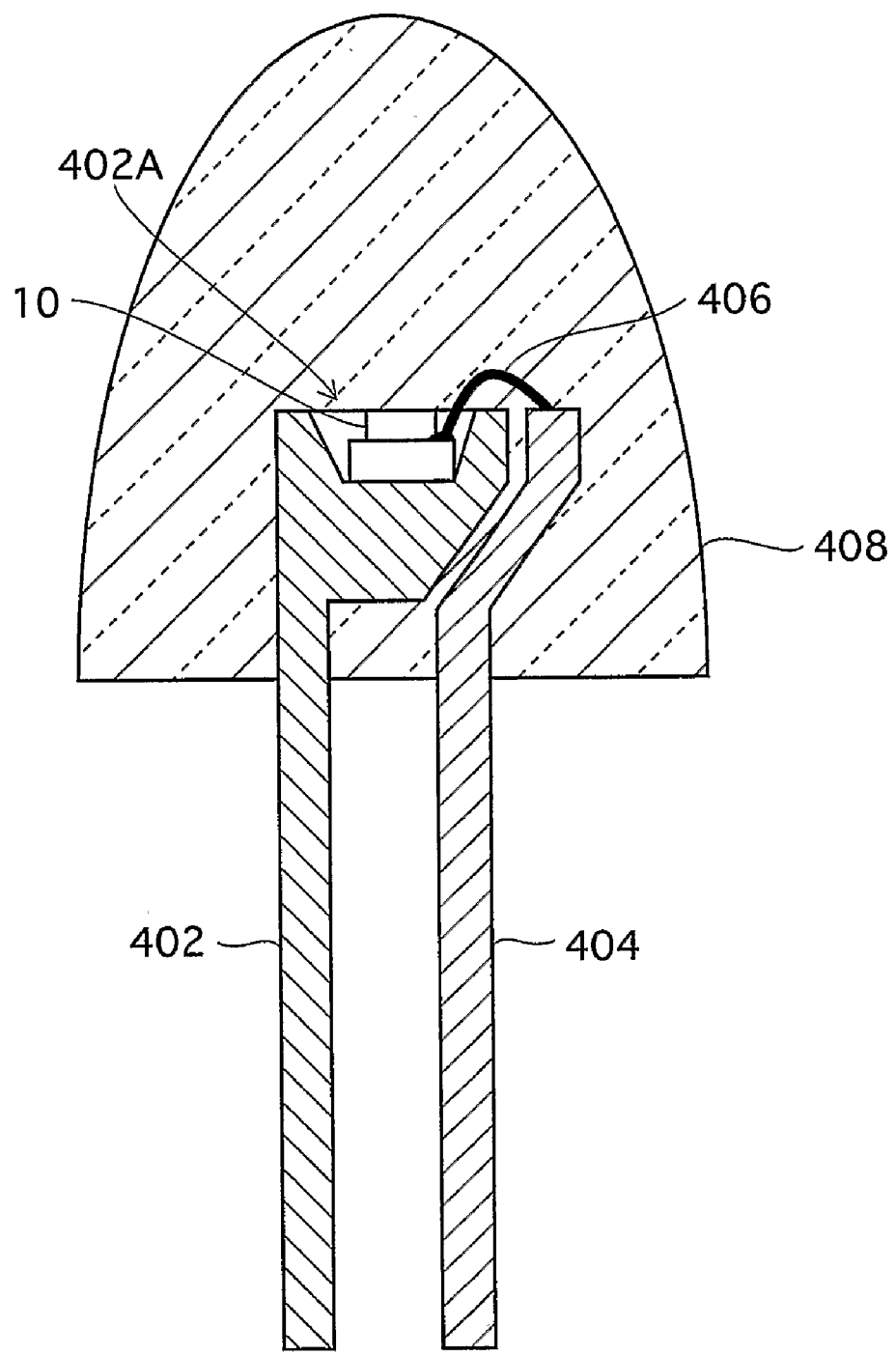
FIG. 15 is a view showing a bullet LED according to the embodiment.

FIG. 15 is a longitudinal sectional view of a so-called bullet LED 400 (hereinafter, simply "LED 400") having the semiconductor light emitting device 10 (FIG. 1) (the semiconductor light emitting device 10 is not sectioned).

The LED 400 has a pair of leads 402 and 404. One of the leads, which in this case is the lead 402, has a truncated conical recess 402A at one end. The semiconductor light emitting device 10 is mounted on the bottom of the recess 402A. The lead 402 is physically and electrically connected, at the bottom of the recess 402A, to the first power supply terminal 42 (FIG. 1) of the semiconductor light emitting device 10. The lead 404 is electrically connected to the second power supply terminal 36 (FIG. 1) of the semiconductor light emitting device 10 via the bonding wire 406. The semiconductor light emitting device 10 is sealed with an epoxy resin 408, which is a sealing material. The epoxy resin 408 is formed into a domed shape so as to constitute a lens.

Upon application of an electric current to the LED 400 having the above structure via the leads 402 and 404, the semiconductor light emitting device 10 emits white light. The white light is converged by passing through the epoxy resin (lens) 408 toward outside.

Up to this point, the present invention has been described by way of the above embodiment. It is naturally appreciated, however, that the present invention is not limited to the above specific embodiment and various modifications including the following are possible.

In principle, the semiconductor light emitting device according to the above embodiment has a light emitting element composed of a semiconductor multilayer structure, a single crystal substrate, a first electrode, and a second electrode. The semiconductor multiplayer structure has the following layers epitaxially grown on the single crystal substrate in the stated order to constitute a diode: a first conductive layer made of a p-semiconductor; a light emission layer; a second conductive layer that is made of an n-semiconductor and disposed on a light extracting surface of the light emission layer. The first and second electrodes are connected to the first and second conductive layers, respectively. The semiconductor multilayer structure additionally has a base substrate supporting the light emitting element, a phosphor that is disposed on the base substrate so as to cover the light emitting element and contains a phosphor material having a property of emitting light by absorbing light emitted by the light emission layer. The base substrate has a first power supply terminal and a second power supply terminal that are electrically connected to the first and second electrodes, respectively.

(1) Although the light emitting element in principle has the structure described-above, it is possible to remove the single crystal substrate on which the semiconductor multilayer structure was epitaxially grown. The semiconductor light emitting device having a light emitting element with no single crystal substrate is produced in, for example, the following way. In the step M shown in FIG. 8, the LED chip 14 is mounted over the conductive semiconductor substrate 132, and then the single crystal substrate 26 is separated from the LED chip 14 by a lift-off technique. Alternatively, the single crystal substrate 26 may be removed by girding.

(2) The first conductive layer may be a p-AlGaN layer instead of the p-GaN layer. The second conductive layer may be an n-AlGaN layer instead of the n-GaN layer. In the case where the first conductive layer is made of a p-semiconductor, the second conductive layer needs to be made of an n-semiconductor layer. Reversely, in the case where the first conductive layer is made of an n-semiconductor, the second conductive layer needs to be made of a p-semiconductor.

(3) As in the above embodiment, the InGaN/GaN MQW light emission layer may be used as the light emission layer for emitting light ranging from blue (430-470 nm) to purple (380-430 nm). For emitting near-ultraviolet light (380 nm or shorter), an AlGaN/InGaN MQW light emission layer may be used.

(4) The first conductive layer, the light emission layer, and the second conductive layer may be 0.1-0.5 µm thick, 0.01-0.1 µm thick, and 0.5-3 µm thick, respectively. In addition, each of the first conductive layer, the light emission layer, and the second conductive layer may be made of a single layer or multiple layers. In addition, such multiple layers may be made of mutually different compositions.

(5) As described above, the single crystal substrate is disposed in contact with a main surface of either the first or second conductive layer and used for epitaxially growing the semiconductor multilayer structure. The single crystal substrate may be any of GaN, SiC, and sapphire substrates, and the thickness may be 0.01-0.5 mm.

(6) The materials of the first and second electrodes are not limited. Yet, it is preferable to use a metal material containing, for example, Ni or Ti, which has a relatively low contact resistance with the first or second conductive layer. For improving the light extracting efficiency of the semiconductor light emitting device, it is preferable that the first electrode in contact with the first conductive layer be made from a material reflecting light emitted from the light emission layer. For example, a laminate of Rh/Pt/Au films used in the above embodiment is preferable. In the case where the second electrode is disposed on a main surface of the second conducive layer serving as a light extracting surface, it is preferable that the second electrode be made of a transparent conductive material, such as ITO, for a better light extraction efficiency. Each of the first and second electrodes may be 0.01-3 µm thick.

(7) The material of the base substrate is not specifically limited. For example, the base substrate may be mainly composed of a semiconductor such as Si or SiC, a ceramic such as $Al_2O_3$ or AlN, or a metal such as Au, Al, or Cu. In the case where the base substrate is made of a semiconductor or metal and thus needs to be insulated, it is applicable to dispose an additional layer on the base substrate. Such an additional layer may be made of: an oxide or nitride, such as a silicon oxide or a silicon nitride; a resin, such as epoxy; a composite material containing a resin such epoxy and particles of a metal oxide such as alumina; or a glass material.

In order for supplying an electric current to the semiconductor multilayer structure, it is applicable to provide, on the base substrate, a conductive pattern made of, for example, Au, Al, or Pt, and also junction terminals, a wiring pattern, power supply terminals. Alternatively, to achieve the same purpose, it is applicable to provide a hole drilled through the base substrate and filled with metal such as Cu, Pt, or W, thereby establishing an electrical connection between the conductive patterns formed on each main surface of the base substrate. In the case where the base substrate is made of a semiconductor material such as Si, it is applicable to integrally form an electronic circuit with the base substrate. The electronic circuit is for controlling a supply voltage and current to the semiconductor multilayer structure. In addition, it is applicable, regardless of the substrate material, to provide electronic components on or within the base substrate. The base substrate may be 0.1-1 mm thick. Preferably, the base substrate is mainly made of a material of which thermal conductivity is 1 W/K·m or higher, more preferably 10 W/K·m or higher, or even more preferably 100 W/K·m or higher. In addition, the shape of main surfaces of the base substrate is not limited to a square, which is commonly used. Instead, the main surfaces may be in a polygonal shape such as a hexagon or in a circular shape.

(8) Each of the LED module (FIG. 10) and the surface mount LED (FIG. 14) may be structured without the base substrate 12 (FIG. 1). That is, the LED chip 14 may be mounted directly onto the ceramic substrate 202 (FIG. 10) or 302 (FIG. 14). Naturally, when making such a modification, it is necessary to appropriately modify the shapes of components, such as bonding pads and power supply terminals, to be disposed on the ceramic substrate 202 or 302. In the case of such an LED module or surface mount LED, the ceramic substrate 202 (FIG. 10) or 302 (FIG. 14) serves as the base substrate.

(9) The phosphor is made of a resin, such as silicone or epoxy, or a glass in which particles of a phosphor material that emit light by absorbing light emitted from the light emission layer are dispersed. Examples of phosphor materials emitting red light include $(Ca, Sr)S:Eu^{2+}$, $Sr_2Si_5N_8:Eu^{2+}$, $BaSi_7N_{10}:Eu^{2+}$, $CaAlSiN_3:Eu^{2+}$, $La_2O_2S:Eu^{3+}$, and $Y_2O_2S:Eu^{3+}$. Examples of phosphor materials emitting yellow light include $(Sr, Ba)_2SiO_4:Eu^{2+}$, $(Y, Gd)_3Al_5O_{12}:Ce^{3+}$. Furthermore, examples of phosphors emitting green light include $(Ba, Sr)_2SiO_4:Eu^{2+}$, $Y_3(Al, Ga)_5O_{12}:Ce^{3+}$, $SrAl_2O_4:Eu^{2+}$, $BaMgAl_{10}O_{17}:Eu^{2+}$, or $Mn^{2+}$. Furthermore, examples of phosphors emitting blue light include $(Ba, Sr)MgAl_{10}O_{17}:Eu^{2+}$, $Mn^{2+}$, $(Sr, Ca)_{10}(PO_4)_6Cl_{12}:Eu^{2+}$.

In the case where the light emission layer emits blue light, the phosphor needs to at least contain, in addition to a phosphor material emitting blue or green light, a phosphor material emitting red light. As a result, the blue light is mixed with the yellow or green light and also with the red light, so that the phosphor emits white light. In the case where the light emission layer emits purple or near-ultraviolet light, the phosphor needs to at least contain, in addition to phosphor materials emitting blue and yellow light, phosphor materials emitting red and green light. As a result, the blue, green, yellow, and red light is mixed, so that the phosphor emits white light.

INDUSTRIAL APPLICABILITY

A semiconductor light emitting device according to the present invention is suitably applicable to the fields of illumination in which light emitting elements are desired to be larger in size while suppressing color inconsistency. The fields of illumination cover indoor illumination as well as outdoor illumination including streetlights and vehicle headlights.

The invention claimed is:

1. A semiconductor light emitting device comprising:
   a light emitting element having a semiconductor multilayer structure that includes a light emission layer and is substantially in a shape of a regular hexagonal prism with a substantially regular hexagonal cross section; and
   a phosphor that is substantially in a shape of a cylinder and disposed to cover a main surface and lateral surfaces of the light emitting element, wherein
   the light emitting element has such a size that the substantially regular hexagonal cross section measures 2.8 mm or less in a longest diagonal, and
   $d2/d1 \leq 1.4$ is satisfied, where
   d1 denotes a corner thickness of the phosphor that is measured from a corner of the substantially regular hexagonal prism along a line connecting the corner and a center of the substantially regular hexagonal cross section, and
   d2 denotes a lateral thickness of the phosphor that is a largest thickness measured from a point on a side of the substantially regular hexagonal prism along a perpendicular bisector of the side.

2. The semiconductor light emitting device according to claim 1, wherein
   the phosphor is disposed so that an axis of the cylinder substantially coincides with an axis of the prism.

3. The semiconductor light emitting device according to claim 2, wherein
   a right section of the prism is substantially in a regular hexagonal shape of which a polygon diameter measures at least 1.4 mm.

4. The semiconductor light emitting device according to claim 3, wherein
   the light emitting element is an LED chip having a light-transmitting single crystal substrate on which the semiconductor multilayer structure is epitaxially grown,
   the semiconductor light emitting device further comprises:
   a base substrate on which the LED chip is flip-chip mounted and having a first power supply terminal and a second power supply terminal connected to a p-electrode and an n-electrode of the LED chip, respectively, and
   the phosphor is partly supported by the base substrate.

5. The semiconductor light emitting device according to claim 1, wherein
   a right section of the prism is substantially in a regular hexagonal shape of which a polygon diameter measures at least 1.4 mm.

6. The semiconductor light emitting device according to claim 5, wherein
   the light emitting element is an LED chip having a light-transmitting single crystal substrate on which the semiconductor multilayer structure is epitaxially grown,
   the semiconductor light emitting device further comprises:

a base substrate on which the LED chip is flip-chip mounted and having a first power supply terminal and a second power supply terminal connected to a p-electrode and an n-electrode of the LED chip, respectively, and the phosphor is partly supported by the base substrate.

7. The semiconductor light emitting device according to claim 1, wherein the light emitting element is an LED chip having a light-transmitting single crystal substrate on which the semiconductor multilayer structure is epitaxially grown, the semiconductor light emitting device further comprises:

a base substrate on which the LED chip is flip-chip mounted and having a first power supply terminal and a second power supply terminal connected to a p-electrode and an n-electrode of the LED chip, respectively, and the phosphor is partly supported by the base substrate.

8. An illumination module comprising:

a mounting substrate; and the semiconductor light emitting device of claim 1 mounted on the mounting substrate.

9. An illumination apparatus comprising as a light source the illumination module of claim 8.

10. A surface mount LED comprising the semiconductor light emitting device of claim 1, wherein the light emitting element is an LED chip.

11. A bullet LED comprising the semiconductor light emitting device of claim 1, wherein the light emitting element is an LED chip.

* * * * *